United States Patent
Wolff et al.

(10) Patent No.: US 7,257,756 B2
(45) Date of Patent: Aug. 14, 2007

(54) DIGITAL FREQUENCY SYNTHESIS CLOCKED CIRCUITS

(75) Inventors: Neal Wolff, Beaverton, OR (US); Chee How Lim, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 561 days.

(21) Appl. No.: 10/815,500

(22) Filed: Mar. 31, 2004

(65) Prior Publication Data

US 2005/0229066 A1 Oct. 13, 2005

(51) Int. Cl.
G01R 31/28 (2006.01)

(52) U.S. Cl. .................................... 714/744

(58) Field of Classification Search ............... 714/700, 714/744
See application file for complete search history.

(56) References Cited

U.S. PATENT DOCUMENTS

| 6,583,679 B1* | 6/2003 | Cox et al. ............... 332/149 |
| 7,002,358 B2* | 2/2006 | Wyatt ...................... 324/622 |

* cited by examiner

*Primary Examiner*—James C Kerveros
(74) *Attorney, Agent, or Firm*—Blakely, Sokoloff, Taylor & Zafman LLP

(57) ABSTRACT

Embodiments of the invention may include a reference input port to receive a reference clock, the reference clock being based on a bypass clock, a feedback input port to receive a feedback clock from a clocked circuit, and logic to compare the reference clock and the feedback clock and to generate an output based on the comparison.

33 Claims, 10 Drawing Sheets

DIGITAL FREQUENCY SYNTHESIS CLOCKED CIRCUITS

BACKGROUND

1. Field

Embodiments of the present invention apply to the field of integrated circuit clock generation and supply and, in particular, to generating multiple aligned clocks from a single reference clock.

2. Background

Microprocessors and other controllers require a clock to time the operation of internal circuits and processes. Some processor and controllers have multiple clocks to support a variety of different internal clock domains. The different clock domains can include I/O (Input/Output), data, address, strobe, processing, memory interface, controller interface etc. In many microprocessors, each clock domain has its own clock source, or at least its own PLL (Phase Locked Loop) to generate the internal clock frequency necessary to support that clock domain. In order to support communication across clock domains, the multiple clock domain signals are often aligned with respect to each other.

A bypass clock function is available on a wide range of test platforms. The bypass clock function allows the processor's or controller's clocks and PLLs to be circumvented so that an external tester can precisely control the circuits' clock speeds. The bypass clock speeds may be much lower than the lowest speeds supported by internal PLLs so that internal clocking and synchronization cannot be used. In functional tests for a microprocessor, a bypass clock may be used that operates at 50-100 MHz instead of the circuits' typical 2-3 GHz. Some functional testers may even pulse the bypass clock in individual steps to allow functions at each clock cycle to be evaluated. Bypass clocks may also be used for burn-in testing of microprocessors and controllers. For example, instead of running the circuits at high speed, the circuits may be cycled for burn-in testing at low speed and high temperatures.

The multiple clock domains and the desire for alignment cause difficulties especially in testing. Structural testers and other debug platforms often do not have enough clock pins to support all of the different PLLs and clocks in a bypass or test mode. In addition, the internal clock domains may require alignment with each other and with the tester's internal bus clock in order for tests to successfully be performed. The internal alignment cannot be performed by internal PLLs when the clock speeds are too low for the internal PLLs. The alignment of the internal clock domains with the tester's internal clock bus is typically done manually. With some testers, it is done by the external tester in an automated iteration process that requires many cycles to find sufficient alignment. This can be expensive and time-consuming.

BRIEF DESCRIPTION OF THE DRAWINGS

Embodiments of the present invention will be understood more fully from the detailed description given below and from the accompanying drawings of various embodiments of the invention. The drawings, however, should not be taken to be limiting, but are for explanation and understanding only. In the drawings.

DETAILED DESCRIPTION

Embodiments of the present invention may generate self-aligning clocks at multiple frequencies that may bypass internal PLLs while still allowing for complete functionality of the clocked circuits. A single bypass input clock with a corresponding bypass reference clock may be used with clock divider logic. In some embodiments, a clock overlap detector may be used to digitally align the phase of the clock signals.

Figure 1:
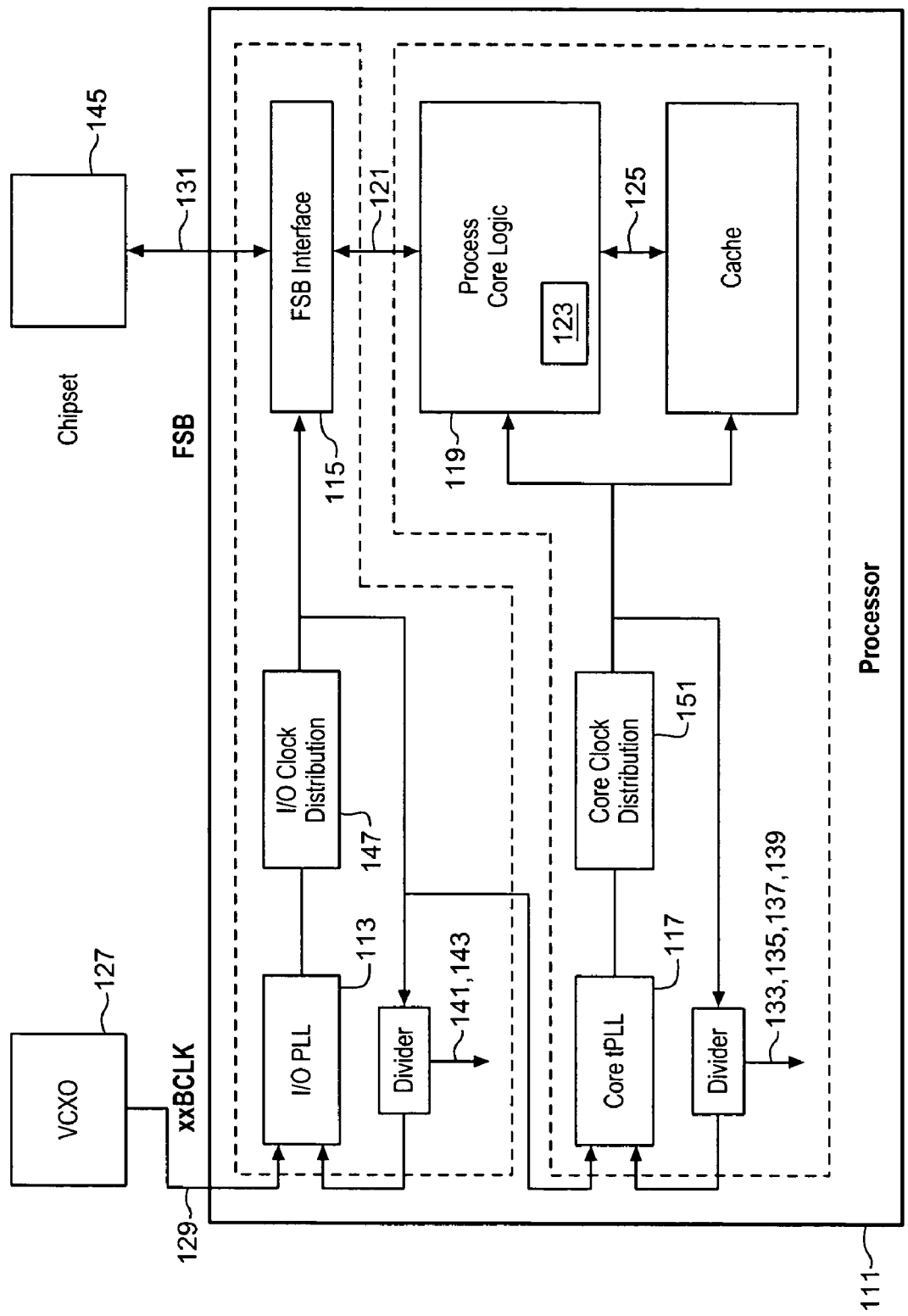
FIG. 1 is a simplified block diagram of a microprocessor showing clock domains and clock sources.

FIG. 1 is a block diagram of a microprocessor 111. The microprocessor may be any type of processor or controller, including any chip with at least one clock synthesizer such as DSPs (Digital Signal Processor), ASICs (Application Specific Integrated Circuit), controllers, I/O controllers, memory, etc. In one embodiment, the processor is an Intel® Pentium® 4 microprocessor, however, embodiments of the invention may be applied to many different clocked circuits. In the example of FIG. 1, there are two PLLs. One, the I/O PLL 113, serves as a clock generator for an I/O (Input/Output) circuit 115 and the other, the Core PLL 117 serves as a clock generator for a Core circuit 119. The I/O circuit in the example of FIG. 1 is a FSB (Front Side Bus) interface that couples to a supporting chipset 145, such as a MCH (memory controller hub). The processor core logic 119 and its core circuits 123 are the processing core that executes the instructions directed at the microprocessor.

The I/O PLL synthesizes the clock frequency for a source synchronous bus 121. The Core PLL, synthesizes a medium clock that synchronizes the internal core circuits 123 and address buses 125. The microprocessor of the illustrated embodiment has seven internal clocking domains. One is an external I/O domain 131, two are address domains 133, 135, two are strobe domains 137, 139, and two are data domains 141, 143. However, the particular domains will vary depending on the design of the circuit.

The two clocks may be set up in different ways. In one embodiment, an external VCXO (Voltage Controlled Crystal Oscillator) 127 provides a reference frequency on an external input pin 129 to the I/O PLL. This reference frequency is cascaded to the Core PLL. In this way, the I/O PLL provides the reference clock to the Core PLL. Alternatively, with an uncascaded PLL both PLLs derive their reference frequency from the same external clock.

With the cascaded PLL example shown in FIG. 1, the I/O PLL is coupled to an I/O clock distribution block 147 that feeds clock signals to the I/O circuit 115, to the core PLL 117, to a divider 149 that supplies the data clock domains and back to the I/O PLL as feedback. The core PLL, on receiving the reference clock through the I/O clock distribution block sends the reference clock to is own core clock distribution block 151.

The core clock distribution feeds the reference clock to its own divider 153 which supplies, for example, the address 133, 135 and strobe domains 137, 139 and a feedback to the core PLL. The I/O clock and the core clock distribution may supply clock signals to more or fewer clock domains than those shown. The configuration of FIG. 1 is provided only as an example.

The clock domains as well as other features of the system may be monitored and tested using I/O pins provided for that purpose. Many microprocessors may be placed in modes that make at least some of the pins available for testing and debugging purposes. Such pins may be used for any purpose selected by the chip designer. These uses may include special clock inputs, triggers, resets, mode setting, result readout, etc.

Figure 2:
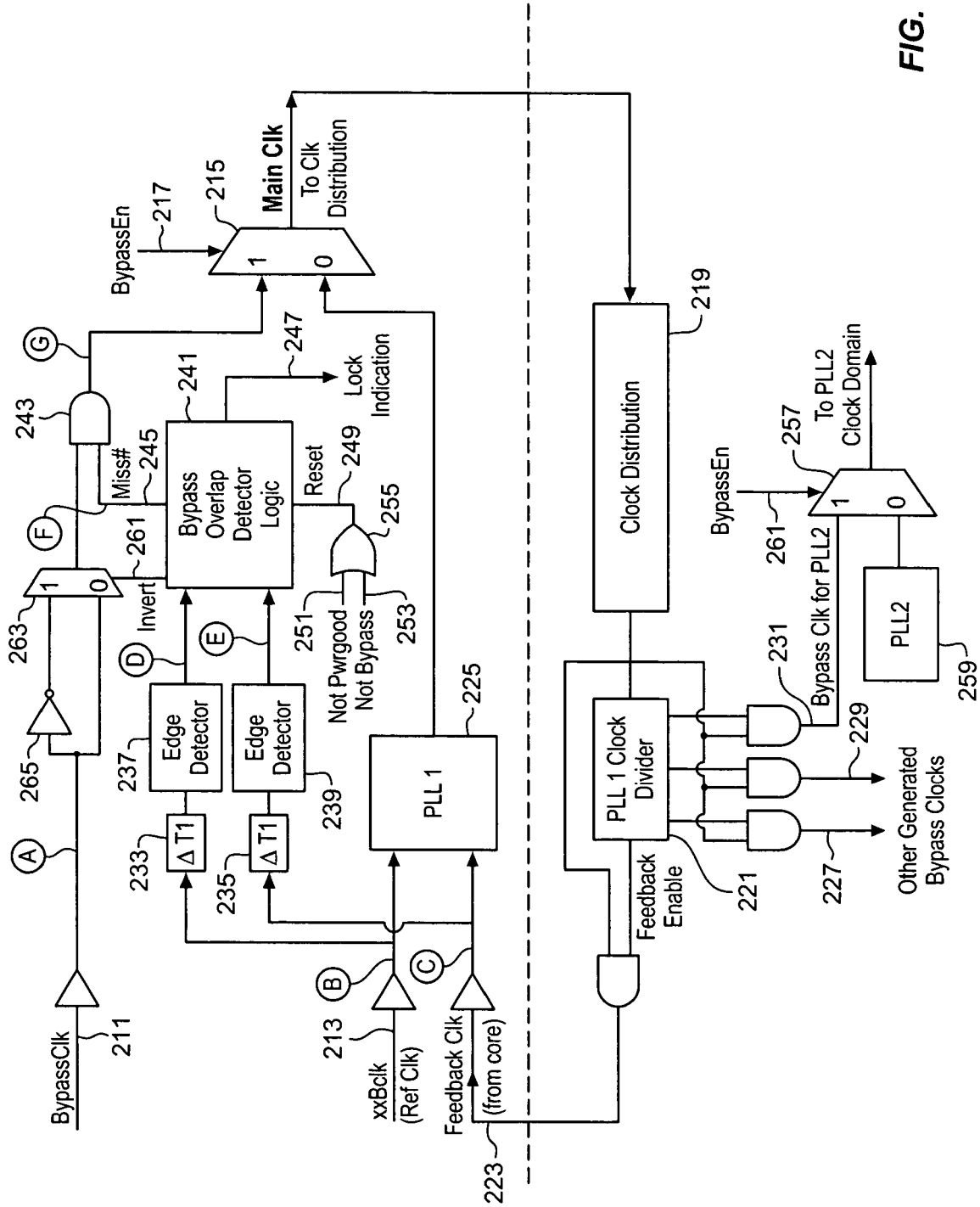
FIG. 2 is a simplified block diagram of logic for a single clock bypass according to an embodiment of the present invention.

As shown in FIG. 2, according to some embodiments of the present invention, a microprocessor or any other controller may be operated using a bypass clock (BypassClk) input port 211. The signal applied to the bypass clock port may be generated by an external test or diagnostic tool. In some applications, the bypass clock will be supplied at a very low clock rate, for example 50-100 MHz or even as a step-by-step signal. A very slow signal is useful for many types of tests but may not be supported by internal PLLs. The bypass clock input may be used in order to bypass a single or multiple PLLs using the single input bypass clock and a reference clock (RefClk) input 213.

The reference clock may be generated by applying a divider to the bypass clock. In FIG. 2, this divider is external to the illustrated system, but it may also be internal to it. The divider value may be set to the circuit's standard internal clock divider value. The circuitry shown in FIG. 2 may be used to rotate the phase of the internally generated clocks, generated by dividing down from the bypass clock frequency, into the correct alignment with respect to the reference clock. The amount of alignment is determined in the described embodiment by comparing the reference clock to a feedback clock 223.

The bypass clock signal 211 is directed through a clock selection multiplexer 215 and then to a main clock distribution block 219. The clock selection multiplexer receives the bypass clock and the reference clock. Using a bypass clock enable input 217, it selects either the bypass clock signal for bypass operation or the reference clock for normal operation. The enable input may be set by an operator or test fixture using a configuration bus.

The clock distribution block 219 may be the same clock distribution used for normal operations. It may use a standard operational clock divider, such as a Core Clock Divider 221 to generate a Feedback Clock (FeedbackClk) pulse 223 to a PLL 225. As shown in FIG. 2, the output of the PLL is fed to the clock selection multiplexer. In normal operation, the PLL 225 would synchronize the feedback clock 223 to the reference clock 213. The single synchronized output would be supplied to the selection multiplexer 215. From there, this signal would be supplied to clock distribution 219 to supply clock signals to the various system clock domains.

However, in bypass mode the bypass enable signal 217 selects the bypass clock 211 instead of the clock from the PLL 225.

As mentioned above, the clock distribution block 219 supplies a synchronized clock signal to a core clock divider 221. This divider generates synchronized clock pulses at divided down frequencies to the other clock domains in the system. While FIG. 2 shows three divided clock output signals 227, 229, 231, any number of different clock signals may be generated. Alternatively, some systems may use a single clock rate for the entire circuit with no divider or distribution.

According to one embodiment, in the bypass clock mode, the output of the PLL 225 is deselected and the resulting signal, if any, is not used. Instead, the reference clock and feedback clock signals 213, 223 are fed to respective controlled delay elements 233, 235. Note that in bypass mode the reference clock (xxBclk) is received from an external tester not from a VCXO. The controlled delay elements each have some delay gates that may be configured to line up the edges of the reference and feedback clocks compensating for differences in the paths of the two clock signals. From the controlled delay elements, the signals are sent to respective edge detectors 237, 239 to equalize any duty cycle discrepancies between the two signals. From the edge detectors, the signals are fed to bypass overlap detector logic 241.

The bypass overlap detector logic is coupled to an AND gate 243. This AND gate has a Miss signal 245 from the bypass overlap detector logic as one input and the main bypass clock signal as the other input. The output of the AND gate is fed to the clock selection multiplexer. The effect of this gate is to manipulate the input bypass clock that is supplied to the processor core and clock distribution by suppressing pulses in the bypass clock signal. Using the Miss signal, the bypass overlap detector logic may suppress one of the bypass clock pulses once per reference clock. In one embodiment, the bypass overlap detector logic may suppress any number of bypass clock pulses by de-asserting the Miss signal for a time that equals the duration for which the bypass clock pulses are to be suppressed.

This suppression of the clock signal causes the reference clock and all of the other clocks supplied by the dividers to be delayed by one reference clock. In one embodiment, the bypass overlap detector logic continues to suppress a bypass clock pulse once per reference clock until the feedback clock and the reference clock overlap or are aligned. When this occurs, the bypass overlap detector logic may assert a lock indication signal 247, indicating alignment with the external bypass signal.

The bypass overlap detector logic uses edge detectors, delays, AND gates to compare the two edge detector outputs, determine whether there is alignment within the designed tolerance, and then assert either a Miss signal or a lock indication signal. It has a reset input 249 that may receive both a NOT PWRGOOD signal 249 and a NOT BYPASS 251 signal. The NOT PWRGOOD signal indicates that not all the power supplies are at their acceptable respective voltages. The processor may have several different power supplies that all ramp up independently and assert a signal when ready for operation. The NOT BYPASS signal indicates that the system is not in a bypass clock mode. These two signals are OR'ed in an OR gate 255 so that if either condition exists then the bypass overlap detector logic is reset.

The lock indication signal 247 allows the status of the clock alignment to be known externally. A variety of different types of signals may be generated depending on the application. In addition, signals from several different lock indicators may be multiplexed or otherwise combined to allow the status of several clock alignments to be observed. In one embodiment, the lock indication signal may be set low before a lock is established and while the bypass overlap detector logic searches for a lock. If a lock is maintained for two cycles of the reference clock then the lock indication may be set high.

If the bypass overlap detector logic fails to achieve a lock after some number of reference clock cycles, for example after 64 reference clock cycles, then, in one embodiment, the Miss signal may be disabled and the bypass clock may be channeled directly to the main clock without the suppression of any pulses. The lock indicator may be set to toggle between high and low to indicate a failure to lock after an appropriate attempt. In this example, the bypass clock will continue to be supplied to the clock distribution without a lock, that is without alignment between the reference clock and the feedback clock.

A safety mechanism may be provided in the event that no lock may be made between the reference clock and the internal clock dividers. Such a safety mechanism may be used when the reference clock is driven externally by the bypass clock and it may also be used when the clock source is internal. As mentioned above, the bypass overlap detector logic may run a normal locking attempt sequence and, if it fails, may indicate so using a toggling lock indication signal. In this case, data may not be able to be transferred within the processor between clock domains. Nevertheless, all internal clock distributions may still be toggling based on the supplied clocks. The internal clocks may toggle even if there is not fixed relationship between the reference clock and the internal clock dividers. The processor may still be operated in applications such as PLL and clock network characterization, burn-in, and other applications which do not require internal clock phase alignment.

As further shown in FIG. 2, the outputs 227, 229, 231 of the core clock divider 221 may be provided to other clock domains of the system. In one example, a clock divider output 231 may be provided to a clock circuit of another clock domain. Such a bypass divided clock output may be provided to another clock selection multiplexer 257. This second clock selection for this second clock domain may be configured to select between a second PLL 259 in accordance with a bypass clock enable input 261. This may be the same bypass clock enable signal 217 as described above for the first clock domain and PLL. In this way, the bypass clock may be propagated to all of the desired clock domains, bypassing the PLL circuits in each. Alternatively, using different bypass enable signals, each clock domain may be controlled independently. A further use of the bypass clock is to perform tests and other operations on sections of the system with bad PLLs or other clocking flaws.

In some applications, the feedback signal may differ from the reference clock by exactly one half-cycle or 180 degrees. The bypass overlap detector logic may be unable to detect an alignment lock. If the logic is unable to create a lock, then logic may assert an invert signal 265. This signal is applied to invert multiplexer 263. The invert multiplexer is connected in the path of the bypass clock input and selects between the bypass clock directly and the bypass clock after it has passed through an inverter 265. By providing the inverter that may be selected if no lock is obtained, the bypass overlap detection logic may obtain a lock even when the reference clock is completely out-of-phase.

Figure 3:
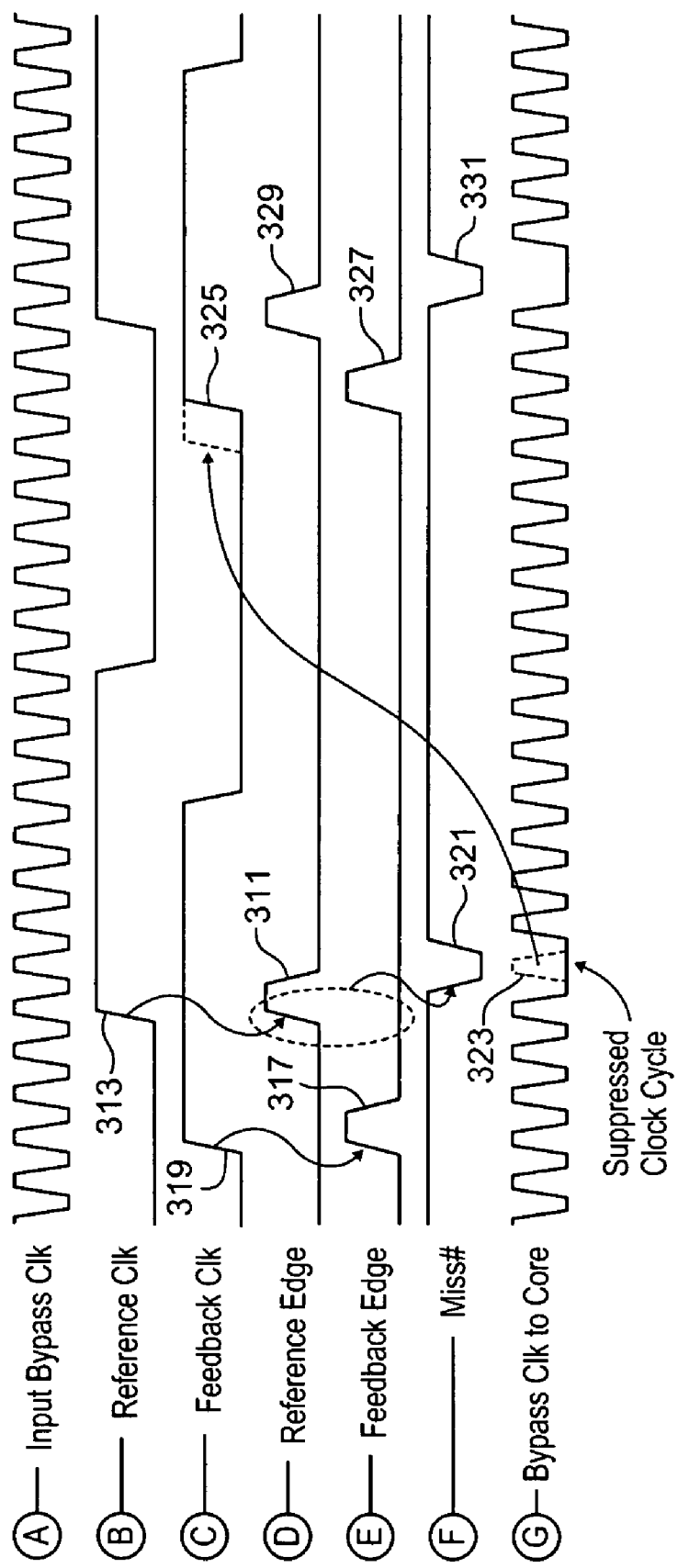
FIG. 3 is a timing diagram for the logic of FIG. 2 in an unaligned state.
Figure 4:
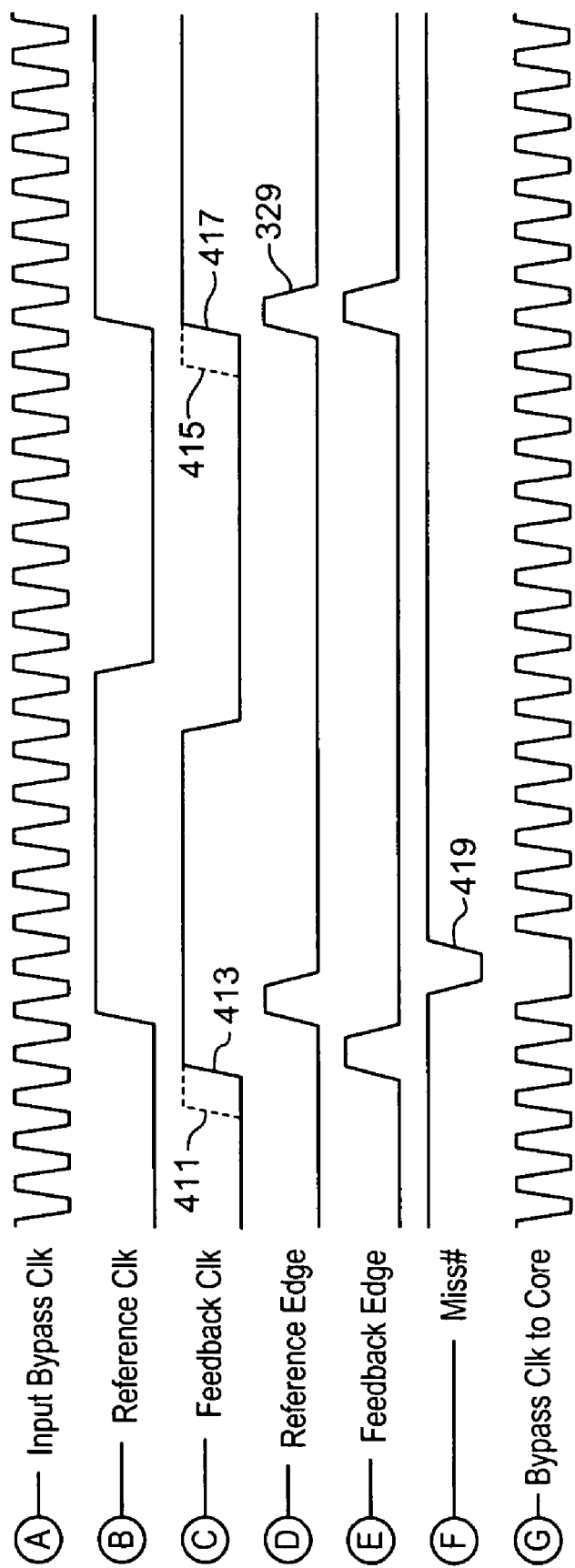
FIG. 4 is a timing diagram for the logic of FIG. 2 in an aligned state.

Referring to FIGS. 3 and 4, the operation of some aspects of the circuitry of FIG. 2 may be better understood. FIG. 3 shows representations of signals as amplitude vertically versus time horizontally. The signals are binary having only two states: high and low. Each of the waveforms is identified by a letter A through G. The correspondence between the waveforms and FIG. 2 is provided by corresponding letters provided near corresponding lines in FIG. 2. In the example of FIG. 3, the reference and feedback clocks are not aligned. Signal A represents the input bypass reference clock as it is received by the system of FIG. 1. Signal B represents the same signal after being divided in an external divider to generate the reference clock. Note that the bypass and reference clocks are aligned and that the dividers have divided the bypass clock by sixteen. Signal C represents the feedback clock from the core clock divider and it is not aligned with the reference clock.

Signal D of FIG. 3 represents the output of the edge detector for the reference clock. This output is a pulse 311 that is aligned with the leading edge 313 of the reference clock pulse. While leading edges and edge detectors are used in the present example, any number of other measures of the reference clock may be used. Signal E, similarly, represents the output of the edge detector of the feedback clock. This signal E pulse 317 is aligned with the leading edge 319 of the feedback clock because it is generated from the feedback clock. It is also spaced apart significantly from the reference clock edge.

Signal F represents the Miss signal generated by the bypass overlap detector logic in response to the reference clock edge and the feedback clock edge. The Miss signal, normally high is asserted as a low pulse 321 on the Miss signal AND gate to suppress the bypass clock signal for the duration of the Miss signal pulse. The bypass overlap detector logic may time the Miss signal pulse to correspond to one pulse of the bypass clock as shown. Alternatively, a longer pulse may be used in order to drive the system more quickly toward a lock. Signal G represents the bypass clock after the Miss signal AND gate showing that one pulse 323, indicated as a dotted line, has been suppressed.

Suppressing the one pulse of the bypass clock before the bypass clock reaches the clock distribution results in retarding the leading edge 325 of the next feedback clock pulse by one bypass clock pulse width. The reference clock, still dependent upon the bypass clock remains unaffected. The corresponding feedback clock edge detector pulse 327 is, accordingly, one step closer to the next reference clock pulse edge 329. Due to the remaining misalignment, another Miss signal 331 is asserted by the bypass overlap detector logic. After a few more cycles, alignment may be achieved. This is the condition shown in FIG. 4. If the feedback clock were trailing the reference clock it may occur that the next clock edge would be further from the closest reference clock edge, however, after a sufficient number of cycles, alignment may still be attained.

FIG. 4 shows the same signals as in FIG. 3 but in a different state. In FIG. 4, the reference clock edge and the feedback clock edge are shown as being only one bypass clock pulse away from alignment. An additional Miss signal brings the two signals together. In FIG. 4, the signal C is shown as having a leading edge 413 that is delayed one bypass clock pulse width from where it otherwise might be with an earlier leading edge 411. This delay is a result of a prior Miss signal not shown. However, since the signal D and signal E are still not aligned, another Miss signal 419 is generated. This results in a further delay in the leading edge 417 of the next feedback clock pulse. The leading edge would otherwise still be advanced as shown in dotted lines 415.

With this delayed pulse 417 of the feedback clock, the feedback clock and the reference clock are aligned and no Miss signal is generated. Instead, the bypass overlap detector logic will generate a lock indication signal. In response to this signal, as described above, the intended applications such as burn-in, diagnostics, debugging etc. may be applied to the circuit.

The conditions shown in FIGS. 3 and 4 show a particular state of alignment of the signals A-G that may occur when a bypass clock is applied. However, the pulses may begin in any number of other states, depending on the details of the particular system. In the example above, in which there are thirty-two bypass clock pulses per feedback clock pulse, the system may begin in any one of thirty-two different alignment conditions. In one such state, the signals are aligned and a lock may be declared immediately. The states shown in FIGS. 3 and 4 are provided for illustration only and not to limit the operation of the bypass overlap detection logic and related circuitry.

As mentioned above, the feedback signal may differ from the reference clock by exactly one half-cycle or 180 degrees and the bypass overlap detector logic may be unable to detect an alignment lock. If the logic is unable to create a lock, then the lock indication will indicate this to the test equipment that supplies the bypass clock. The bypass clock may then be reversed in phase, or polarity by 180 degrees and the lock cycle attempted again. This phase reversal may be achieved internally using the invert signal 265, or it may be achieved by the test equipment reversing the phase of the input clock. The selection of how many cycles to wait before reversing phase will depend upon the application. In one embodiment, in which the reference clock is divided by 16 from the bypass clock, 64 bypass cycles are allowed to elapse before the polarity is reversed.

Figure 5:
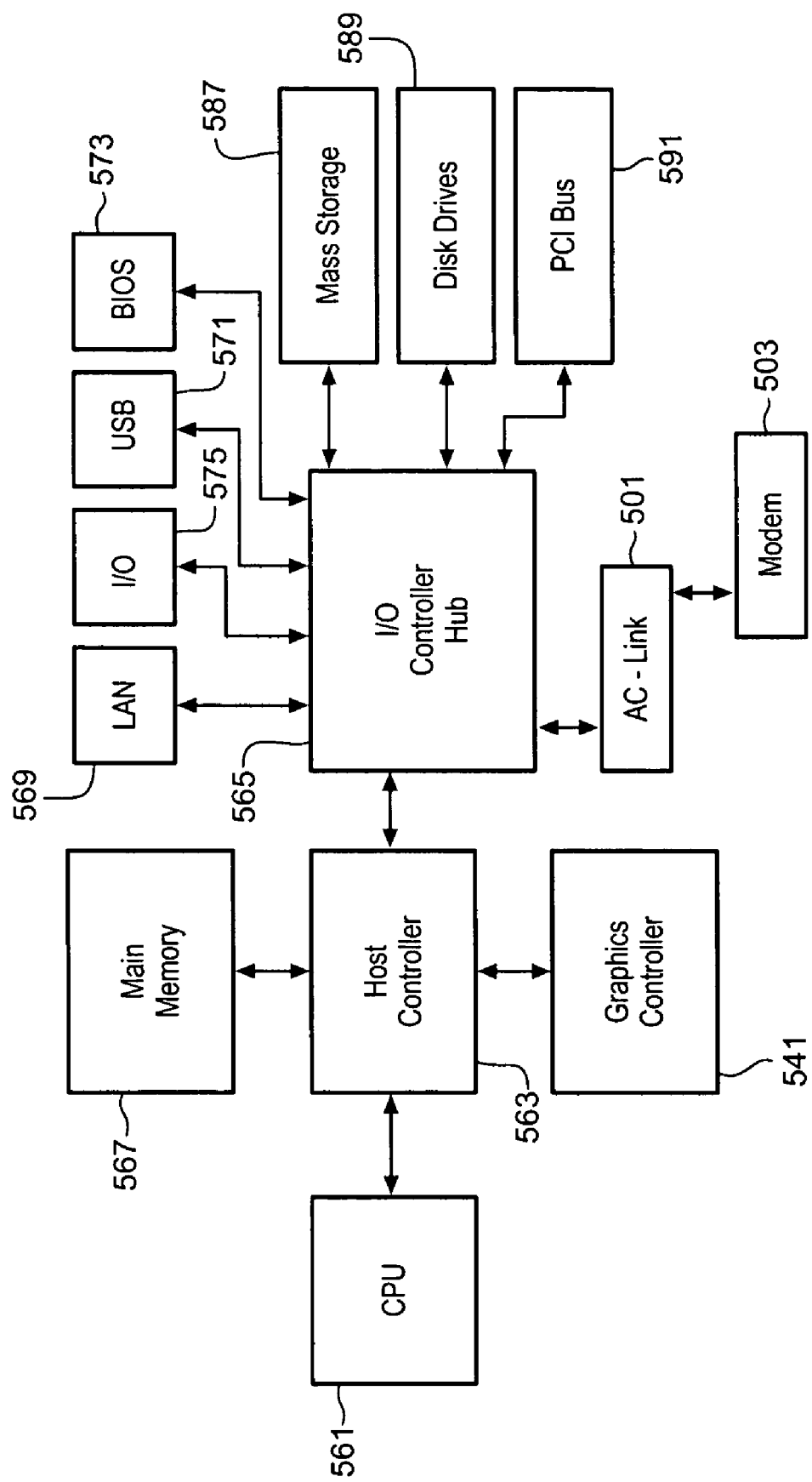
FIG. 5 shows a computer system suitable for use with some embodiments of the present invention.

FIG. 5 shows a computer system suitable for use with a microprocessor or other clocked circuits formed as described above. While embodiments of the present invention are described in the context of a microprocessor, such as the microprocessor 561 shown in FIG. 5, embodiments of the present invention may be adapted for application on a great number of different ICs. Such ICs include most of the circuits shown and described in the context of FIG. 5. In the example of FIG. 5, the computer system may include a CPU (Central Processing Unit) 561 coupled to a Host Controller 563, for example a MCH (Memory Controller Hub) chip. The MCH chip functions as part of a supporting chipset for the CPU. The MCH chip is coupled to main memory 567, such as DRAM (Dynamic Random Access Memory) and to a graphics controller 541.

The MCH chip 563 is also coupled to an ICH (Input/Output controller hub) chip 565. The ICH chip offers connectivity to a wide range of different devices. Well-established conventions and protocols may be used for these connections. The connections may include a LAN (Local Area Network) port 569, a USB (Universal Serial Bus) hub 571, and the local BIOS (Basic Input/Output System) flash memory 573. A SIO (Super Input/Output) port 575 may provide connectivity for a keyboard or other input devices.

The ICH may also provide an IDE (Integrated Device Electronics) bus for connections to disk drives 587, 589 or other large memory devices. The mass storage may include hard disk drives and optical drives. So, for example, software programs, user data, and data files may be stored on a hard disk drive or other drive. In addition CD's (Compact Disk), DVD's (Digital Versatile Disk) and other storage media may be played on drives coupled to the IDE bus.

A PCI (Peripheral Component Interconnect) bus 591 is coupled to the ICH and allows a wide range of devices and ports to be coupled to the ICH, such as network and video adapter cards. There are many more devices available for connection to a PCI port and many more possible functions. The PCI devices may also allow for wired or wireless connections to more remote equipment or any of a number of different interfaces. The remote equipment may allow for communication of programming data, for maintenance or remote control or for gaming, Internet surfing or other capabilities.

Figure 6:
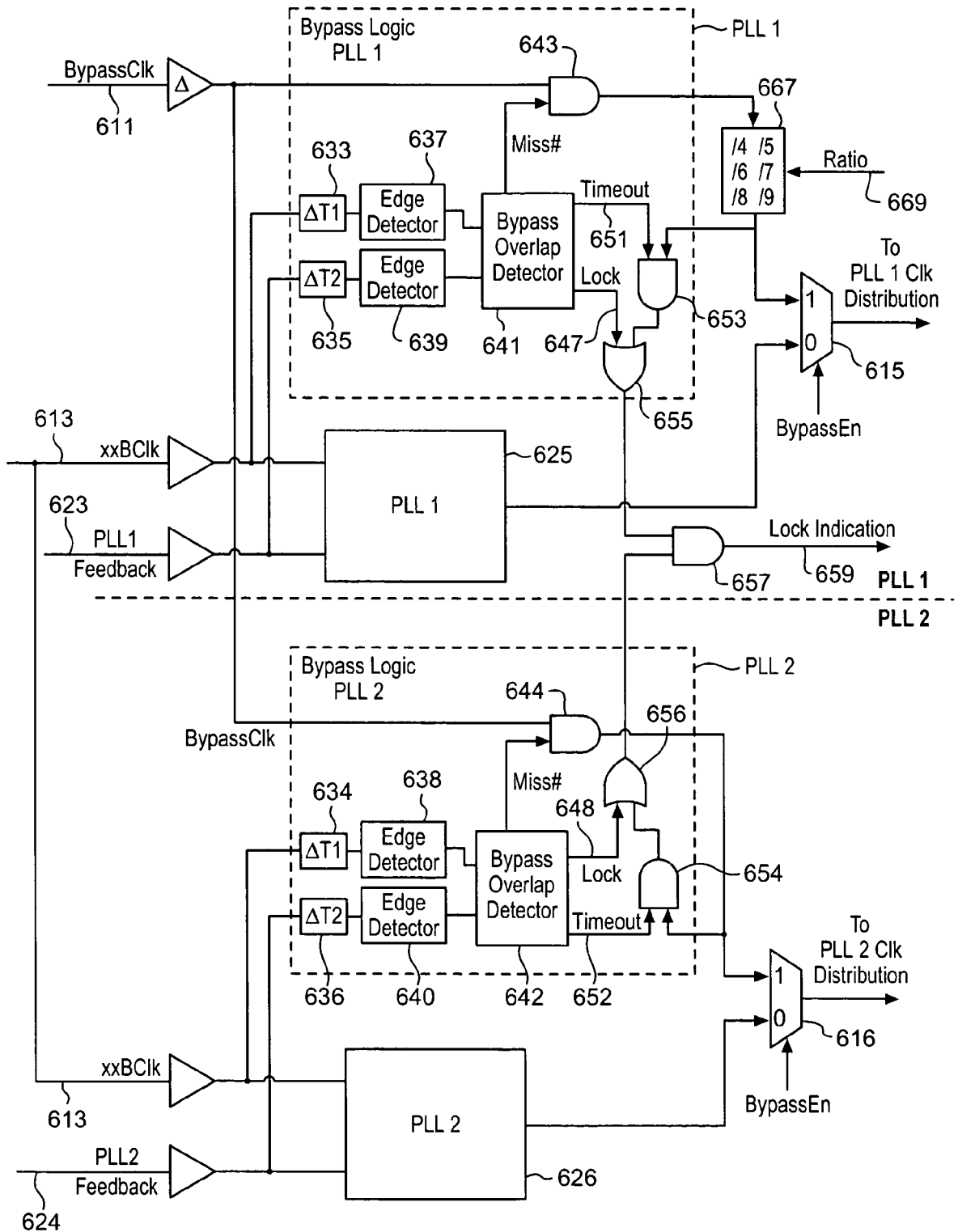
FIG. 6 is a simplified block diagram of logic for a single clock bypass with two clock domains according to an embodiment of the present invention.

Referring to FIG. 6, an alternative embodiment of the present invention allows the bypass clock to be provided directly to more than one clock domain. In the example of FIG. 2, the clock domains are labeled as PLL 1 and PLL 2. These domains may correspond to any of the clock domains mentioned above or to other clock domains (not shown) depending on the application. The diagram of FIG. 6 is similar to that of FIG. 2, however, it has been simplified to aid in understanding. Any of the features of FIG. 2, that are not shown in FIG. 6 may be added to the embodiment of FIG. 6. Similarly, features shown in FIG. 6 may be added to the embodiment of FIG. 2.

Similar to the microprocessor or controller shown in FIG. 2, the microprocessor or controller of FIG. 6 may be operated using a bypass clock (BypassClk) input port 611. The signal applied to the bypass clock port may be generated by an external test or diagnostic tool. The bypass clock input may be used in order to bypass internal PLLs using the single input bypass clock and a reference clock (RefClk) input 613. The reference clock is compared to a feedback clock 623.

In the PLL 1 clock domain, the bypass clock signal 611 is directed through a clock selection multiplexer 615 and then to a main clock distribution block (not shown). This clock distribution may be similar to that shown in FIG. 2 and it produces a feedback clock 623 that may be divided down from the output of the clock selection multiplexer. The clock selection multiplexer receives the bypass clock and the reference clock output of the PLL 625 and selects either the bypass clock signal for bypass operation or the reference clock for normal operation.

Before being fed to the PLL 1 clock distribution, the bypass clock may be fed through a divider 667, which may divide the clock signal by some number, for example, 4, 5, 6, 7, 8, or 9, in response to a ratio input signal 669. Alternatively, this division may be performed in the clock distribution block. The divider not only allows for special clock rates to be supplied to the clock distribution block it may also divide down the clock rate of the feedback clock 623 to the bypass overlap detector. This allows a much higher accuracy in the alignment of the clock pulses.

The PLL 1 clock distribution block also generates a Feedback Clock (FeedbackClk) pulse 623 which is fed to the PLL 625 for the PLL 1 clock domain. As in FIG. 2, the output of the PLL is fed to the clock selection multiplexer. In normal operation, the PLL 625 synchronizes the feedback clock 623 to the reference clock 613. The single synchronized output is supplied to the selection multiplexer 615.

As in FIG. 2, in the bypass clock mode, the output of the PLL 625 is deselected and the PLL output signal, if any, is not used. Instead, the reference clock and feedback clock signals 613, 623 are fed to respective controlled delay elements 633, 635 and from the controlled delay elements, to respective edge detectors 637, 639. The detected edges are fed to bypass overlap detector logic 641.

The bypass overlap detector logic is coupled to an AND gate 643 that receives a Miss signal 645 in order to manipulate the input bypass clock by suppressing pulses as described above with respect to FIG. 2 until the bypass clock and the reference clock are aligned.

The PLL 2 clock domain operates similar to the PLL 1 clock domain and receives the same bypass clock signal 611 and reference clock signal 613. In the PLL 2 clock domain, the bypass clock signal 611 is directed through a clock selection multiplexer 616 and then to a PLL 2 clock distribution block (not shown). This clock distribution may be similar to that shown in FIG. 2. The clock selection multiplexer receives the bypass clock and the PLL 2 output signal and selects either the bypass clock signal for bypass operation or the PLL 2 clock for normal operation. While no divider is shown for the PLL 2 clock domain between the bypass clock and the clock selection multiplexer, it may be included or excluded depending upon the application. The PLL 2 clock distribution block also generates a Feedback Clock (FeedbackClk) pulse 624 which is fed to the PLL 626 for the PLL 2 clock domain.

As in the PLL 1 domain, the output of the PLL is fed to the clock selection multiplexer. However, in the bypass clock mode, the output of the PLL 625 is deselected and the resulting signal, if any, is not used. The reference clock and feedback clock signals 613, 624 are fed to respective controlled delay elements 634, 636 and from there to respective edge detectors 638, 640. From the edge detectors, the signals are fed to bypass overlap detector logic 642 for PLL 2. The PLL 2 bypass overlap detector logic is also coupled to an AND gate 644 that receives a Miss signal 646 in order to align the bypass clock and the reference clock.

The features described above for FIG. 6 operate in a similar manner but allow each clock domain to synchronize independently with the bypass clock. In addition, if lock indication or other signaling is provided, the tester may independently monitor the status of each clock domain independently. As a further benefit, each domain may be tested independently even if one or more other domains are inoperative.

With more input pins, the two PLL domains, PLL 1, PLL 2, may be modified to receive two different bypass clock signals. In other words, the bypass clock signal to the PLL 1 clock selector 615 may be different from the bypass clock signal supplied to the PLL 2 clock selector 616. This allow the two domains to be driven at the same or different speeds. Since the two sections align with the bypass clock independently, the two domains may be operated independently of each other.

Each of the two clock domains also have a lock indication signal 647, 648 generated by the respective bypass overlap detector logic 641, 642. The lock indication signals allow the status of the clock alignment to be known externally. A variety of different types of signals may be generated depending on the application. Such signals are described above with respect to FIG. 2.

In the example of FIG. 6, the lock indications are low when there is no lock and high when there is a lock. However, these signals 647, 648 are combined with other signals to allow several clock domains to be monitored on a single pin. As shown in FIG. 6, each bypass detector overlap logic signal also has a timeout output 651, 652 coupled to an AND gate 653, 654. The other connection of each AND gate is coupled to the clock signal that is provided to the clock distribution through the bypass selector 615, 616. These AND gates are respectively coupled to OR gates 651, 656 that also receive the lock indication. The two OR gates are joined together as inputs to an AND gate 657 that produces a combined lock indication signal 659.

Figure 7:
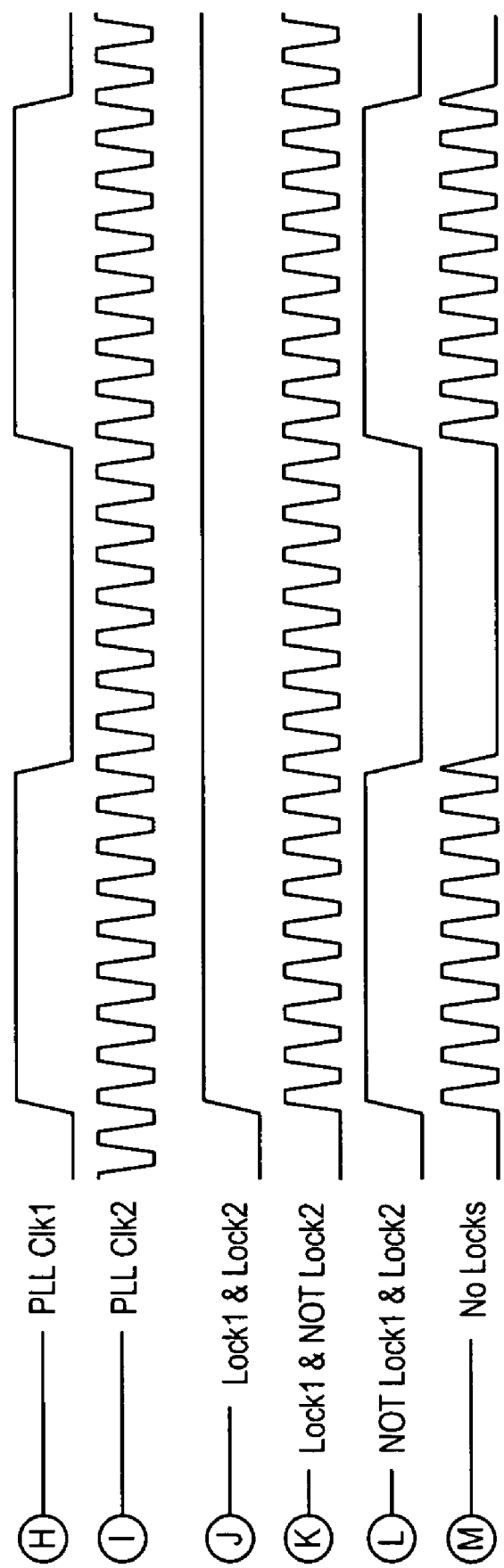
FIG. 7 is a timing diagram for outputs of a lock indication logic circuit.

Using this combinatorial logic, it is possible to determine whether either or both bypass overlap detector logic blocks have achieved, lock, are still trying to achieve lock, or have timed out. The operation of the system is illustrated in part in the waveforms of FIG. 7 in which binary amplitude is shown on the vertical scale and time on the horizontal scale. Each of the waveforms is identified by a letter H through M. The correspondence between the waveforms and FIG. 6 is provided by corresponding letters provided near corresponding lines in FIG. 6. The waveforms of FIG. 7 represent the combined lock indication signal 659 which would be present on an output pin of the microprocessor.

The first two waveforms H, I, represent the input frequency clocks that are applied as inputs to the timeout AND gates 653, 655. The PLL 1 Clock H is divided in a bypass clock divider 667 by 16 as compared to the PLL 2 Clock I. This allows the influence of the two waveforms to easily be distinguished.

When both bypass overlap detectors have achieved a lock, there will be a steady high signal on both of the lock OR gates 655, 656. These two signals when AND'ed will produce a steady high signal as shown in waveform J. On the contrary, when one bypass overlap detector has achieved a lock and the other has not, one will assert a high but the other will assert a low state. In the combined AND gate 657, the output 659 will be low until both bypass overlap detectors achieve a lock or asserted a timeout. In the lock OR gates, the low state at the lock input will allow the signal from the timeout AND gate to pass. If there is no timeout indication, the timeout AND gate will stay low and the lock OR gate will stay low.

If there is no timeout signal (asserted low) then the timeout AND gate will output a zero (low). Accordingly, if one but not both bypass overlap detectors has a lock and the other bypass overlap detector has timed out, then the combined lock indication signal will toggle at the clock rate of the unlocked clock domain. Waveform K corresponds to the clock in the PLL 2 clock domain indicating that the PLL 1 clock domain has a lock and the PLL 2 clock domain has timed out. Conversely, waveform L toggles to the clock in the PLL 1 clock domain indicating that the PLL 2 clock domain has a lock and the PLL 1 clock domain has timed out.

If neither bypass overlap detector has a lock, and they have both timed out then the lock OR gates will both send the corresponding bypass clock signal. The lock indication AND gate will combine these to provide a binary sum of the two waveforms as shown in waveform M.

Signals from several different lock indicators may be multiplexed or otherwise combined in a variety of different ways to allow the status of several clock alignments to be observed. The logic gates of FIG. 6 show one way that may be effective when two clock domains are used, however modifications may be made to accommodate more clock domains and other types of signals. Alternatively, more pins may be allocated to monitor the status of the bypass overlap detector logic in each clock domain.

Figure 8:
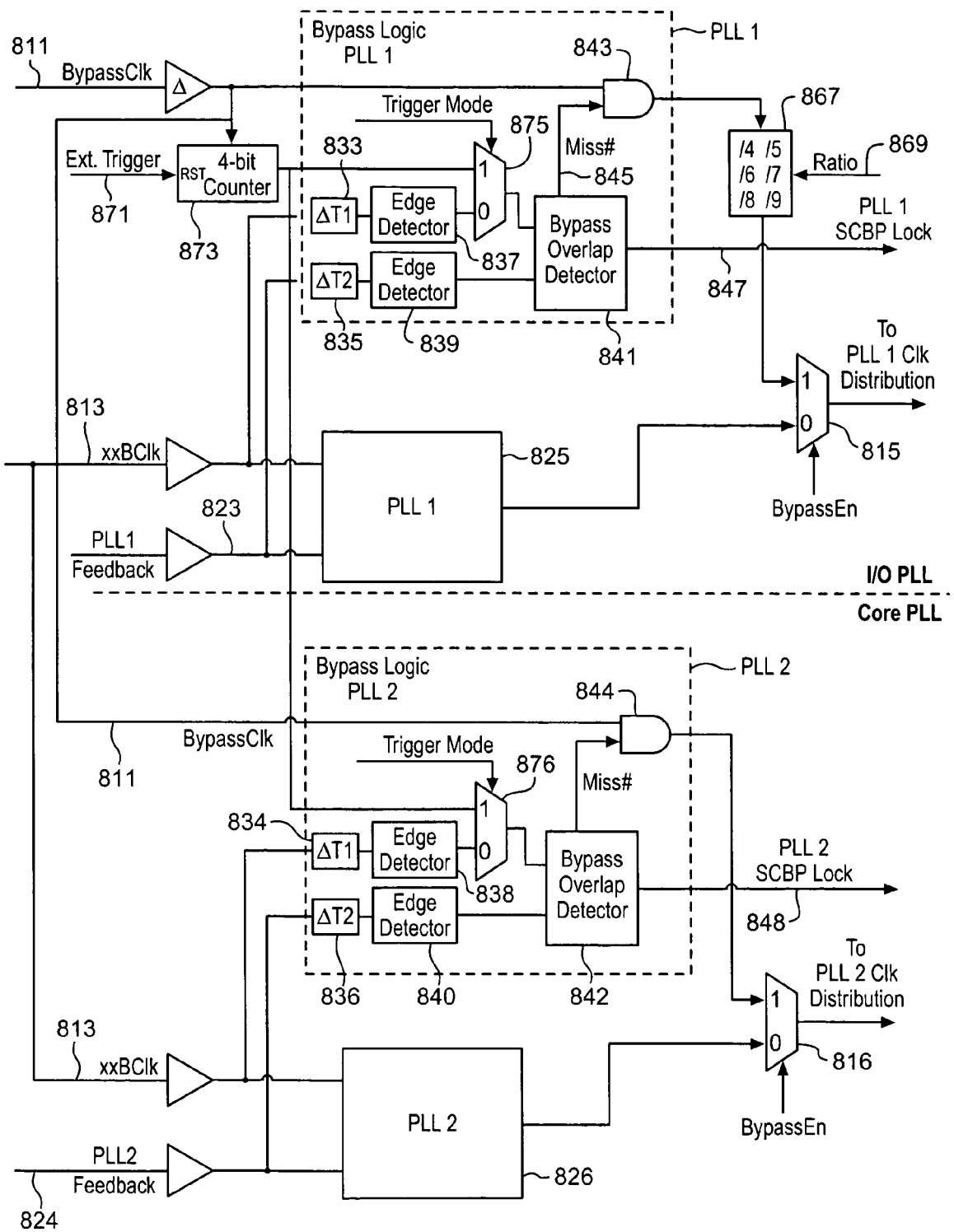
FIG. 8 is a simplified block diagram of logic for a single clock bypass with an external trigger mode according to an embodiment of the present invention.

FIG. 8 shows another embodiment of the invention in which a trigger mode is provided for two clock domains. FIG. 8 is similar to FIG. 6 in many respects. Features shown in FIG. 8 may be added to FIGS. 2 and 6 and features shown in FIGS. 2 and 6 may be added to FIG. 8. As in FIG. 6, the microprocessor or controller of FIG. 8 may be operated using a bypass clock (BypassClk) input port 811. The signal applied to the bypass clock port may be generated by an external test or diagnostic tool. The bypass clock input may be used in order to bypass internal PLLs using the single input bypass clock and a reference clock (RefClk) input 813. The reference clock is compared to a feedback clock 823.

In the PLL 1 clock domain, the bypass clock signal 811 is directed through a clock selection multiplexer 815 and then to a main clock distribution block (not shown). This clock distribution may be similar to that shown in FIG. 2 and it produces a feedback clock 823 that may be divided down from the output of the clock selection multiplexer. The clock selection multiplexer 815 receives the bypass clock 811 and the clock output of the PLL 825 and selects either the bypass clock signal for bypass operation or the PLL clock for normal operation.

As in FIG. 2, in the bypass clock mode, the output of the PLL 825 is deselected and the PLL output signal, if any, is not used. Instead, the reference clock (xxBClk) and feedback clock signals 813, 823 are fed to respective controlled delay elements 833, 835 and from the controlled delay elements, to respective edge detectors 837, 839. The detected edges are fed to bypass overlap detector logic 841.

The bypass overlap detector logic is coupled to an AND gate 843 that receives a Miss signal 845 in order to manipulate the input bypass clock by suppressing pulses as described above with respect to FIG. 2 until the bypass clock and the reference clock are aligned.

The PLL 2 clock domain operates similar to the PLL 1 clock domain and receives the same bypass clock signal 811 and reference clock signal 813. In the PLL 2 clock domain, the bypass clock signal 811 is directed through a clock selection multiplexer 816 and then to a PLL 2 clock distribution block (not shown). The clock selection multiplexer receives the bypass clock and the PLL 2 output signal and selects either the bypass clock signal for bypass operation or the PLL 2 clock for normal operation.

As in the PLL 1 domain, the output of the PLL 826 is fed to the clock selection multiplexer. However, in the bypass clock mode, the output of the PLL 825 is deselected and the resulting signal, if any, is not used. The reference clock (xxBClk) and feedback clock signals 813, 824 are fed to respective controlled delay elements 834, 836 and from there to respective edge detectors 838, 840. From the edge detectors, the signals are fed to bypass overlap detector logic 842 for PLL 2. The PLL 2 bypass overlap detector logic is also coupled to an AND gate 844 that receives a Miss signal 846 in order to align the bypass clock and the reference clock.

The embodiment of FIG. 8 further includes a trigger mode not shown in FIGS. 2 and 6 although such a feature may be adapted for use in the embodiments shown in both figures. In the trigger mode, an external trigger signal 871 is applied to a counter 873, in the present example a four-bit counter. The trigger signal is a reset that zeroes the counter and may be provided on an external pin by external test equipment. It may also be generated internally in an internal test process. The counter circuit receives the bypass clock signal 811 and produces an output every sixteenth pulse. This output is fed to a trigger signal selector 875.

The trigger signal selector is placed in the path between the reference clock edge detector 837 and the bypass overlap detector 841. The trigger signal selector, in response to a trigger mode signal selects the trigger signal instead of the reference clock edge. This allows the bypass overlap detector logic 841 to compare a divided down version of the bypass signal from the counter 873 directly to the feedback clock edge detector output 839. Accordingly, the bypass detector logic will align the feedback clock directly with the bypass clock. The trigger mode signal may be generated in many different ways. It may be derived from the external trigger signal or it may be generated from an internal configurable parameter.

As a result, when the system is placed in trigger mode, the xxBClk or reference clock signal is bypassed. Instead, an internal down-divided version of the bypass clock is provided to the bypass overlap detector logic. This avoids the need for an accurate clock divider and corresponding input pins in the external tester. The reference clock may be generated by applying a divider to the bypass clock. The divider value may be set to any desired value by setting parameters in the 4-bit counter. In one example, it may be used to emulate clock frequencies in the clock domain's clock distribution circuit. The reset pin allows a diagnostic cycle or a test to be started at a very specific point by initializing all the clocks in the selected clock domain.

As further shown in FIG. 8, the output from the 4-bit counter may also be provided to other clock domains, such as the PLL 2 clock domain in FIG. 8. In FIG. 8, the trigger counter and the external input are not replicated in the PLL 2 domain. Instead, the counter 873 output is supplied directly to a second trigger mode selector 876 in the path between the bypass clock edge detector 838 and the bypass overlap detector 842.

The PLL 2 clock domain is provided with a clock selector 876 that receives the 4-bit counter output as well as the xxBClk 813 reference signal and selects one of the signals to provide to the bypass overlap detector logic 842. The selector also responds to a trigger mode signal which may be the same as or different from the trigger mode signal for the PLL 1 clock domain. Further dividers or counters (not shown) may be provided between the two clock domains so that they may be driven at different speeds. The PLL 2 clock domain may also include a separate reset input, as shown for the PLL 1 clock domain.

Using the trigger mode, both clock domains may be driven off the same single bypass clock input and synchronized internally. Events may be timed precisely using the external reset trigger allowing for a greater variety of tests to be performed successfully.

Figure 9:
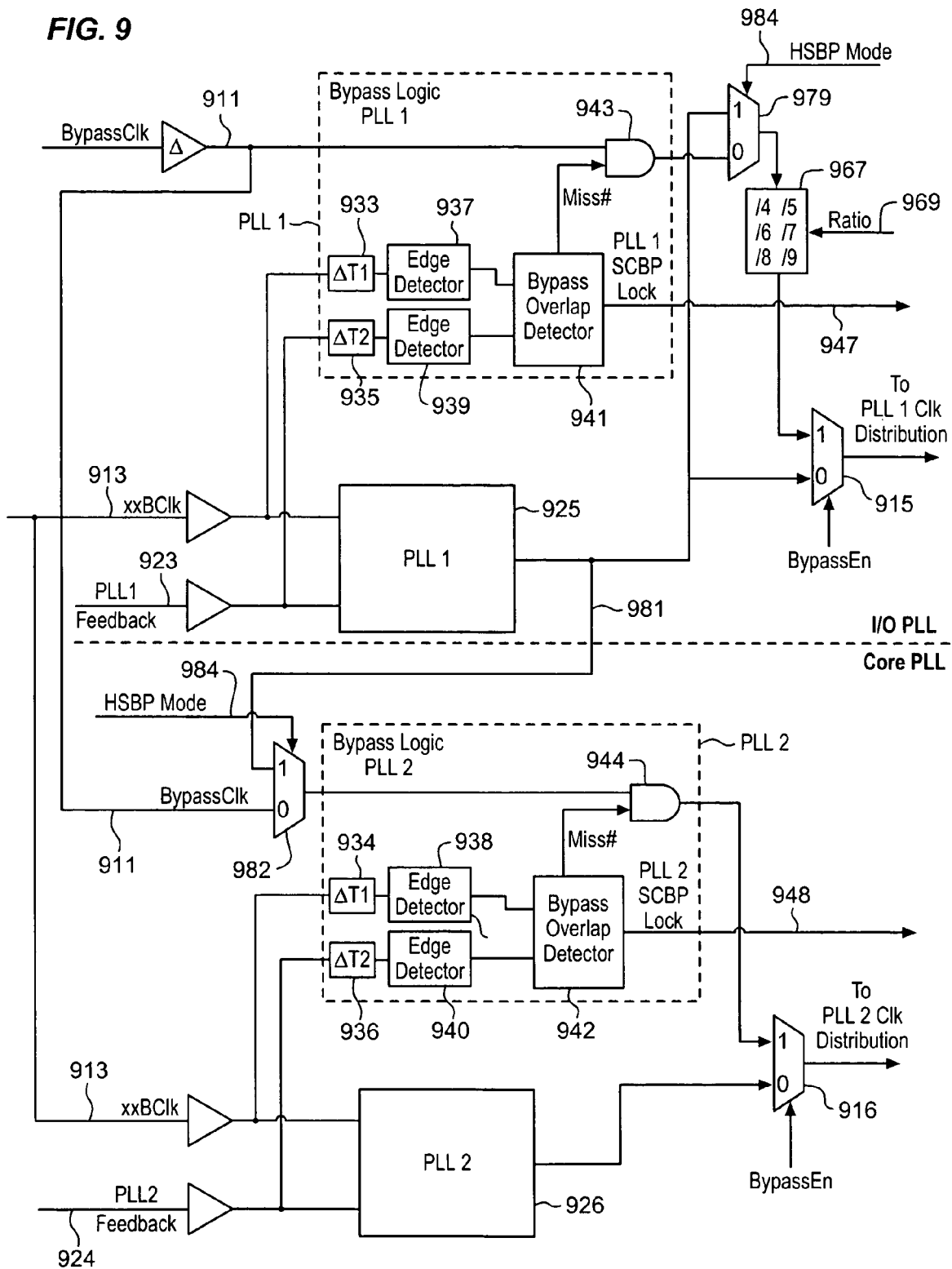
FIG. 9 is a simplified block diagram of logic for a single clock bypass with a high speed bypass mode according to an embodiment of the present invention.

FIG. 9 shows another embodiment of the invention in which a high speed bypass mode is provided for two clock domains. FIG. 9 is similar to FIGS. 2, 6, and 8 in many respects. Features shown in FIG. 9 may be added to FIGS. 2, 6 and 8 and features shown in FIGS. 2, 6 and 8 may be added to FIG. 9. As in FIGS. 2, 6 and 8, the microprocessor or controller of FIG. 9 may be operated using a bypass clock (BypassClk) input port 911. The signal applied to the bypass clock port may be generated by an external test or diagnostic tool. The bypass clock input may be used in order to bypass internal PLLs using the single input bypass clock and a reference clock (RefClk) input 913. The reference clock is compared to a feedback clock 923.

In the PLL 1 clock domain, the bypass clock signal 911 is directed through a clock selection multiplexer 915 and then to a main clock distribution block which produces a feedback clock 923 that may be divided down from the output of the clock selection multiplexer. The clock selection multiplexer receives the bypass clock and the clock output of the PLL 925 and selects either the bypass clock signal for bypass operation or the PLL clock output for normal operation. The selector will also select the PLL clock for a high speed bypass mode to be described in more detail below.

As in FIG. 2, the reference clock and feedback clock signals 913, 923 are fed to respective controlled delay elements 933, 935 and from the controlled delay elements, to respective edge detectors 938, 939. The detected edges are fed to bypass overlap detector logic 941. However, in the high speed bypass mode, the bypass overlap detector is bypassed. The bypass overlap detector logic is coupled to an AND gate 943 that receives a Miss signal 945 in order to manipulate the input bypass clock signal in the bypass clock mode.

The PLL 2 clock domain operates similar to the PLL 1 clock domain and receives the same bypass clock signal 911 and reference clock signal 913. In the PLL 2 clock domain, the bypass clock signal 911 is directed through a clock selection multiplexer 916 and then to a PLL 2 clock distribution block (not shown). The clock selection multiplexer receives the bypass clock and the PLL 2 output signal and selects either the bypass clock signal for bypass operation or the PLL 2 clock for normal operation.

As in the PLL 1 domain, the output of the PLL 926 is fed to the clock selection multiplexer. However, in the bypass clock mode, the output of the PLL 925 is deselected and the resulting signal, if any, is not used. The reference clock and feedback clock signals 913, 924 are fed to respective controlled delay elements 934, 936 and from there to respective edge detectors 938, 940. From the edge detectors, the signals are fed to bypass overlap detector logic 942 for PLL 2. The PLL 2 bypass overlap detector logic is also coupled to an AND gate 944 that receives a Miss signal 946 in order to align the bypass clock and the reference clock.

As further shown in FIG. 9, a high speed bypass mode clock selector 979 is inserted in the path between the bypass clock signal 911 and a divider 967. The high speed bypass mode clock selector selects between the bypass clock after it has been manipulated by the Miss signal at AND gate 943 and the PLL 925 clock output. As a result, when the high speed bypass mode is enabled, the bypass clock input 911 is disabled. Instead the PLL clock output is provided to a divider 967 and then to the clock distribution 915 for the PLL 1 clock domain.

The PLL 1 925 clock output is generated from an external clock input 913 and the feedback clock 923 from the clock distribution circuit. The external clock (xxBClk) may be provided by the test system as mentioned above. Regulating the external tester frequency allows for precise control over the clock rate that is sent to the divider. In addition, since the PLL clock output is provided to the divider that is also used for the bypass clock, a divider ratio may be set using the settable ratio parameter 969 to achieve a wider range of clock frequencies.

For the PLL 1 clock domain, operation is almost normal. One difference is that the source of the external reference clock may be a tester rather than a board-mounted VCXO, although a board-mounted VCXO may alternatively be used. The additional divider 967 provided for the bypass clock may be used to adjust the clock frequencies to the PLL 1 clock distribution.

By using the PLL 925, and the divider 967 (which affects the feedback 923 frequency), a very high clock rate may be generated by the PLL. This high clock rate may be provided as a replacement for a bypass clock to the second clock domain. As further shown in FIG. 9, the PLL 1 output clock is provided on a line 981 directly to a clock selector 982 in the PLL 2 clock domain. This selector, in response to a high speed bypass mode signal 984, selects between the bypass clock input 911 and the PLL 1 clock output 981. The selector is placed before the Miss AND gate 944 so that the bypass overlap detector logic 942 is allowed to align the high speed bypass clock with the feedback clock 924. For the PLL 2 clock domain, the high speed bypass mode is operated with the PLL 2 clock domain in the bypass mode described with respect to FIGS. 2, 6, and 8.

Routing the PLL 1 clock output to the bypass clock input of the PLL 2 clock domain allows the PLL 2 clock domain to be operated at high speed without using the PLL 926 for the PLL 2 clock domain. This allows for even more flexibility in testing and debugging, it even allows for testing to be performed at normal operational speeds or higher if the PLL for the second clock domain is defective or inoperative.

As with FIGS. 6 and 8, the roles of the two clock domains shown in FIG. 9 may be reversed. So, for example, in FIG. 9, the system may be configured so that the output of PLL 2 may be used as a bypass clock for the PLL 1 clock domain. By providing additional selectors, the system may be configured so that either PLL may be used to drive either clock domain. In addition, while FIGS. 6, 8, and 9 show only two clock domains, further clock domains may be added to resemble either or both of the clock domains shown.

Figure 10:
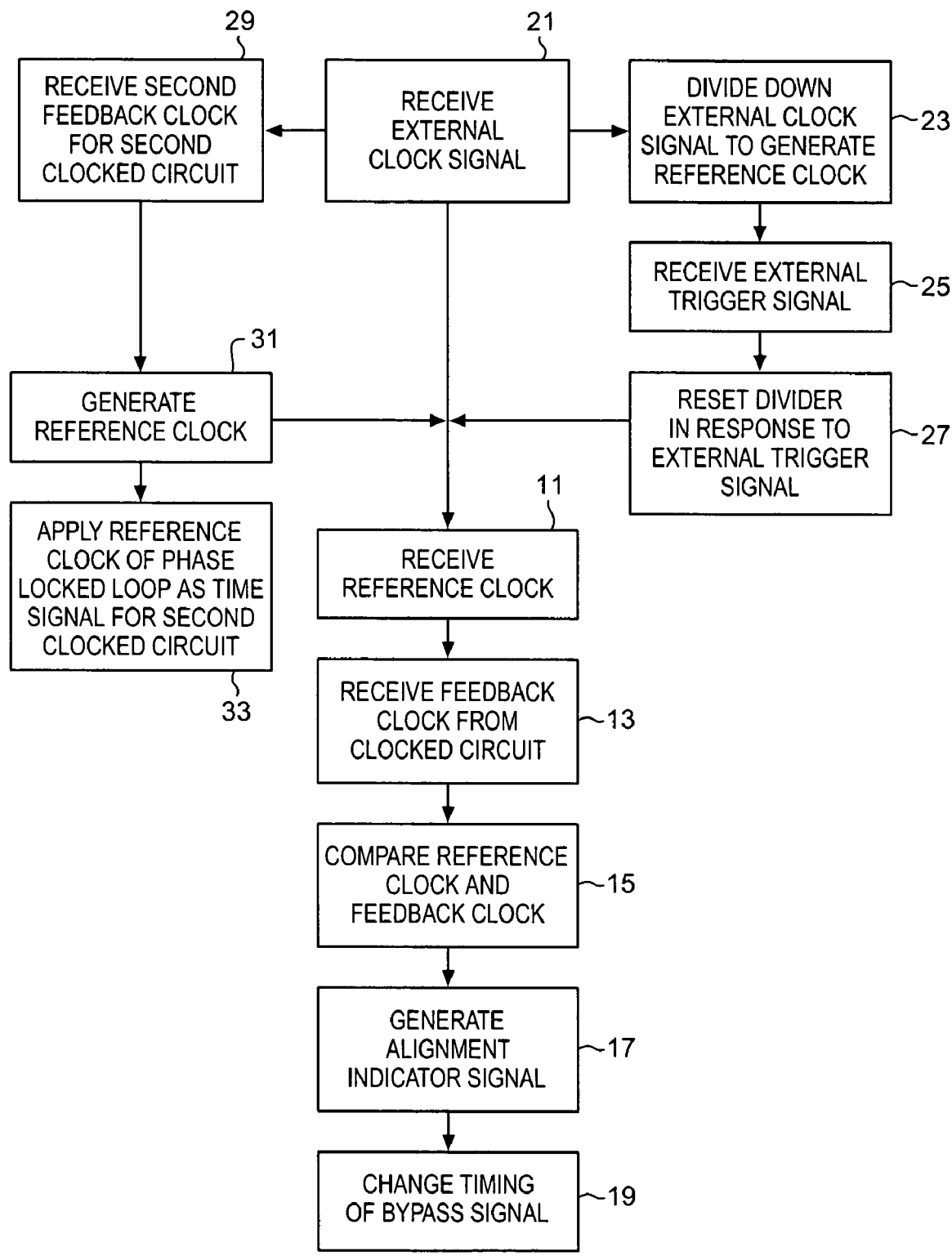
FIG. 10 is a process flow diagram of employing a bypass clock according to an embodiment of the invention.

The operation of the systems described above may be better understood with reference to the process flow diagram of FIG. 10. In FIG. 10, a reference clock is received at block 11. The reference clock may correspond to external inputs or internal inputs generated in different ways as described above. At block 13 a feedback clock is received from a clocked circuit. As mentioned above, this may be a feedback clock from a clock distribution circuit and indicate the timing within a processing core or some other circuit.

At block 15, the reference clock and the feedback clock are compared and different results are possible. The comparison may be done by bypass overlap detector logic as described above. At block 17, an alignment indicator signal is generated. This signal can be ported to an output pin, or combined with other signals for output. Alternatively, or in addition, the timing of the bypass or reference clock signal is changed at block 19. This timing change may alter the alignment state indicated on by the alignment indicator signal.

As described above, the reference clock may be received from a any one of many different sources. In one embodiment it is received as an external clock signal at block 21. This external clock signal can be received directly as the reference clock at the bypass overlap detector logic. Alternatively, the external clock may be divided down to generate the reference clock at block 23. In addition, the divider may be in the form of a counter and the counter operation may include receiving an external trigger signal at block 25, and resetting the divider in response to the external trigger signal at block 27.

As a different alternative the external clock signal may be applied to a timing circuit such as a PLL. A second feedback clock from a second clocked circuit is received at the timing circuit at block 29. At block 31, the timing circuit generates the reference clock. This reference clock may also be used as the reference clock for block 11. In addition, the reference clock of the timing circuit may be applied as a timing signal for the second clocked circuit at block 33. Any of the reference clock generation operations may be performed based on external or internal clock signals and many of the operations may be performed within an integrated circuit or externally.

It is to be appreciated that a lesser or more equipped bypass clock distribution, chip, and computer system than the examples described above may be preferred for certain implementations. Therefore, the configurations may vary from implementation to implementation depending upon numerous factors, such as price constraints, performance requirements, technological improvements, or other circumstances. Embodiments of the invention may also be applied to other types of software-driven systems that use different hardware architectures than that shown in the Figures.

In the description above, for purposes of explanation, numerous specific details are set forth in order to provide a thorough understanding of embodiments of the present invention. It will be apparent, however, to one skilled in the art that embodiments of the present invention may be practiced without some of these specific details. In other instances, well-known structures and devices are shown in block diagram form.

Embodiments of the present invention may include various operations. The operations of embodiments of the present invention may be performed by hardware components, such as those shown in the Figures, or may be embodied in machine-executable instructions, which may be used to cause general-purpose or special-purpose processor or logic circuits programmed with the instructions to perform the operations. Alternatively, the operations may be performed by a combination of hardware and software.

Embodiments of the present invention may be provided as a computer program product which may include a machine-readable medium having stored thereon instructions which may be used to program a computer system (or other electronic devices) to perform a process according to embodiments of the present invention. The machine-readable medium may include, but is not limited to, floppy diskettes, optical disks, CD-ROMs, and magneto-optical disks, ROMs, RAMs, EPROMs, EEPROMs, magnet or optical cards, flash memory, or other type of media/machine-readable medium suitable for storing electronic instructions. Moreover, embodiments of the present invention may also be downloaded as a computer program product, wherein the program may be transferred from a remote computer to a requesting computer by way of data signals embodied in a carrier wave or other propagation medium via a communication link (e.g., a modem or network connection).

Many of the methods and apparatus are described in their most basic form but operations may be added to or deleted from any of the methods and components may be added or subtracted from any of the described apparatus without departing from the basic scope of the present claims. It will be apparent to those skilled in the art that many further modifications and adaptations may be made. The particular embodiments are not provided as limitations but as illustrations. The scope of the claims is not to be determined by the specific examples provided above but only by the claims below.

What is claimed is:

1. An apparatus comprising:
   a bypass clock input to receive a bypass clock from an external source for bypass clock operation;
   a reference input port to receive a reference clock, the reference clock being based alternately on an external oscillator for normal operation or on the bypass clock;
   a clock selection multiplexer to select the bypass clock for bypass operation or the reference clock for normal operation;
   a feedback input port to receive a feedback clock from a clocked circuit; and
   logic to compare the reference clock based on the bypass clock in bypass operation and the feedback clock and to generate an output based on the comparison the output being a signal to indicate whether the reference clock and the feedback clock are aligned.

2. The apparatus of claim 1, wherein the bypass clock is an external clock signal.

3. The apparatus of claim 1, further comprising a clock distribution circuit to generate the feedback clock.

4. The apparatus of claim 1, wherein the output comprises a pulse suppression signal to suppress a portion of the bypass clock.

5. The apparatus of claim 4, wherein the portion of the bypass clock is a single pulse of the bypass clock.

6. The apparatus of claim 4, wherein the pulse suppression signal changes the timing of the feedback signal.

7. The apparatus of claim 4, further comprising a bypass clock input and a gate coupled to the bypass clock input and to the pulse suppression signal to suppress a portion of the bypass clock signal in response to the pulse suppression signal.

8. The apparatus of claim 1, further comprising a reference edge detector to receive the reference clock signal and provide a reference edge detection signal to the logic and a feedback edge detector to receive the feedback clock signal and to provide a feedback edge detection signal to the logic, and wherein the output comprises an indicator signal to indicate whether the reference edge detection signal and the feedback edge detection signal are aligned.

9. The apparatus of claim 1, wherein the frequency divider comprises a counter with a reset trigger to reset the reference clock in response to an external trigger signal.

10. The apparatus of claim 1, wherein the clock selection multiplexer comprises a clock selector to suppress an internally synchronized clock based on the external oscillator for normal operation and substitute the bypass clock.

11. The apparatus of claim 1, further comprising:
    a second reference input port to receive the reference clock;
    a second feedback input port to receive a second feedback clock from a second clocked circuit;
    a second logic to compare the reference clock and the second feedback clock and to generate a second indicator signal to indicate whether the reference clock and the second feedback clock are aligned based on the second logic comparison; and
    indication logic to receive the first indicator signal and the second indicator signal and to generate a combined lock indication.

12. The apparatus of claim 11, wherein the indication logic comprises a gate to combine the first indicator signal with a first frequency signal, a second gate to combine the second indicator signal with a second frequency signal, and a third gate to combine the results of the first gate and the second gate.

13. The apparatus of claim 1, further comprising a second clocked circuit and a phase circuit to receive the bypass clock and a second feedback clock from the second clocked circuit to generate the reference clock.

14. The apparatus of claim 13, wherein the phase circuit comprises a phase locked loop for the second clock circuit and wherein the reference clock is applied as a clock circuit for the second clocked circuit.

15. A computer system comprising:
    a voltage controlled crystal oscillator to generate a primary clock;
    a phase locked loop having a first input to receive the primary clock, a second input to receive a feedback clock from a clocked circuit, and an circuit; a phase locked loop output to generated a synchronized clock for normal operation;

a bypass gate to select one of the synchronized clock for normal operation or a bypass clock for bypass operation to apply as a timing signal for the clocked circuit; and logic to compare a reference clock and the feedback clock and to adjust the timing of the bypass clock independent of the phase locked loop based on the comparison, wherein the reference clock is based on the bypass clock.

16. The system of claim 15, wherein the clocked circuit is an input/output circuit to receive the bypass clock as the timing signal, the apparatus further comprising a memory controller coupled to the input/output circuit.

17. The system of claim 15, further comprising a clock distribution circuit to generate the feedback clock from the timing signal.

18. The system of claim 15, further comprising a frequency divider to receive the bypass clock and to generate the reference clock by dividing the bypass clock in response to a configurable ratio parameter.

19. The system of claim 15, wherein the frequency divider comprises a counter with a reset trigger to reset the reference clock in response to an external trigger signal.

20. The system of claim 15, wherein the logic generates a lock indicator signal to indicate whether the reference clock and the feedback clock are aligned.

21. The system of claim 15, further comprising a second clocked circuit and a phase circuit to receive the bypass clock and a second feedback clock from the second clocked circuit to generate the reference clock.

22. A method comprising:
receiving a bypass clock from an external source for bypass clock operation;
receiving a reference clock, the reference clock being based alternately on an external oscillator for normal operation or on the bypass clock;
selecting one of the bypass clock for bypass operation or the reference clock for normal operation;
receiving a feedback clock from a clocked circuit; and
comparing the reference clock and the feedback clock in bypass operation and generating an output based on the comparison, the output being a signal to indicate whether the reference clock and the feedback clock are aligned.

23. The method of claim 22, wherein generating an output comprises generating a pulse suppression signal to change the timing of the bypass signal.

24. The method of claim 22, wherein the reference clock comprises the bypass clock divided down by a ratio determined in response to a configurable ratio parameter.

25. The method of claim 22, further comprising receiving an external trigger signal and resetting the reference clock in response to the external trigger signal.

26. The method of claim 22, further comprising receiving the bypass clock and a second feedback clock for a second clocked circuit at a phase locked loop for the second clocked circuit and generating a timing signal at the phase locked loop.

27. The method of claim 26, further comprising applying the timing signal of the phase locked loop as a timing signal for the second clocked circuit.

28. An article of manufacture comprising a machine-accessible medium including data that, when accessed by a machine, cause the machine to perform operations comprising:
receiving a bypass clock from an external source for bypass clock operation;
receiving a reference clock, the reference clock being based alternately on an external oscillator for normal operation or on the bypass clock;
selecting one of the bypass clock for bypass operation or the reference clock for normal operation;
receiving a feedback clock from a clocked circuit; and
comparing the reference clock and the feedback clock in bypass operation and generating an output based on the comparison, the output being a signal to indicate whether the reference clock and the feedback clock are aligned.

29. The article of claim 28, wherein generating an output comprises generating a pulse suppression signal to change the timing of the bypass signal.

30. The article of claim 28, wherein the reference clock comprises the bypass clock divided down by a ratio determined in response to a configurable ratio parameter.

31. The article of claim 28, wherein the machine-accessible medium further includes data that cause the machine to perform operations comprising receiving an external trigger signal and resetting the reference clock in response to the external trigger signal.

32. The article of claim 28, wherein the machine-accessible medium further includes data that cause the machine to perform operations comprising receiving the bypass clock and a second feedback clock for a second clocked circuit at a phase locked loop for the second clocked circuit and generating a timing signal at the phase locked loop.

33. The article of claim 32, wherein the machine-accessible medium further includes data that cause the machine to perform operations comprising applying the timing signal of the phase locked loop as a timing signal for the second clocked circuit.

* * * * *

UNITED STATES PATENT AND TRADEMARK OFFICE
CERTIFICATE OF CORRECTION

PATENT NO. : 7,257,756 B2 Page 1 of 1
APPLICATION NO. : 10/815500
DATED : August 14, 2007
INVENTOR(S) : Wolff et al.

It is certified that error appears in the above-identified patent and that said Letters Patent is hereby corrected as shown below:

In column 4, at line 51, after "delays," insert --and--.

Signed and Sealed this

Twenty Second Day of April, 2008

JON W. DUDAS
*Director of the United States Patent and Trademark Office*